(12) United States Patent
Hong et al.

(10) Patent No.: US 11,430,523 B2
(45) Date of Patent: Aug. 30, 2022

(54) STORAGE DEVICE AND METHOD FOR OPERATING THE SAME

(71) Applicant: Samsung Electronics Co., Ltd., Suwon-si (KR)

(72) Inventors: Jin Woo Hong, Seoul (KR); Chan Ha Kim, Hwaseong-si (KR); Yun Jung Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 105 days.

(21) Appl. No.: 17/036,430

(22) Filed: Sep. 29, 2020

(65) Prior Publication Data

US 2021/0249085 A1 Aug. 12, 2021

(30) Foreign Application Priority Data

Feb. 6, 2020 (KR) ........................ 10-2020-0014009

(51) Int. Cl.
| | | |
|---|---|---|
| *G06F 12/00* | (2006.01) | |
| *G11C 16/14* | (2006.01) | |
| *G06F 12/02* | (2006.01) | |
| *G06F 12/0882* | (2016.01) | |
| *G06K 9/62* | (2022.01) | |
| *G06N 3/04* | (2006.01) | |
| *G11C 16/26* | (2006.01) | |
| *G11C 16/34* | (2006.01) | |

(Continued)

(52) U.S. Cl.
CPC .......... *G11C 16/14* (2013.01); *G06F 12/0246* (2013.01); *G06F 12/0882* (2013.01); *G06K 9/6256* (2013.01); *G06N 3/0454* (2013.01); *G11C 16/26* (2013.01); *G11C 16/3472* (2013.01); *G11C 29/42* (2013.01); *G11C 29/44* (2013.01)

(58) Field of Classification Search
CPC ..... G11C 16/14; G11C 16/26; G11C 16/3472; G11C 29/42; G11C 29/44; G06F 12/0246; G06F 12/0882; G06F 3/0619; G06F 3/065
See application file for complete search history.

(56) References Cited

U.S. PATENT DOCUMENTS

| | | | |
|---|---|---|---|
| 7,450,420 B2 | 11/2008 | Sinclair et al. | |
| 8,156,290 B1 * | 4/2012 | Vanninen | G06F 3/061 |
| | | | 711/213 |

(Continued)

OTHER PUBLICATIONS

Dongyang Li et al., "PIPULS: Predicting I/O Patterns Using LSTM in Storage Systems" *2019 International Conference on High Performance Big Data and Intelligent Systems (HPBD&IS)*, 2019, pp. 14-21.

(Continued)

*Primary Examiner* — Mohammed A Bashar
(74) *Attorney, Agent, or Firm* — Harness, Dickey & Pierce, P.L.C.

(57) ABSTRACT

A storage device is provided. The storage device includes a nonvolatile memory device including a first block and a second block, and a controller including processing circuitry configured to, predict a number of writes to be performed on the nonvolatile memory device using a machine learning model, determine a type of reclaim command based on the predicted number of writes, the reclaim command for reclaiming data of the first block to the second block, and issue the reclaim command.

18 Claims, 13 Drawing Sheets

(51) Int. Cl.
    *G11C 29/42*          (2006.01)
    *G11C 29/44*          (2006.01)

(56) References Cited

U.S. PATENT DOCUMENTS

| | | |
|---|---|---|
| 9,256,371 B2 | 2/2016 | Franceschini et al. |
| 10,013,286 B2 | 7/2018 | Chen et al. |
| 10,282,140 B2 | 5/2019 | Yang et al. |
| 10,379,739 B1 | 8/2019 | Bazarsky et al. |
| 2016/0335144 A1 | 11/2016 | Cai et al. |
| 2017/0286252 A1 | 10/2017 | Illikkal et al. |
| 2019/0073297 A1 | 3/2019 | Goss et al. |
| 2019/0253520 A1 | 8/2019 | Maharana et al. |
| 2022/0043695 A1* | 2/2022 | Gallegos ............... G06F 9/4881 |

OTHER PUBLICATIONS

Extended European Search Report dated Sep. 9, 2021 issued in corresponding European Appln. No. 21155076.9.

* cited by examiner

STORAGE DEVICE AND METHOD FOR OPERATING THE SAME

CROSS-REFERENCE TO RELATED APPLICATION

This application claims priority from Korean Patent Application No. 10-2020-0014009 filed on Feb. 6, 2020 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a storage device and a method for operating the same. More particularly, the present disclosure relates to a storage device using machine learning and a method for operating the same.

2. Description of the Related Art

Semiconductor memory devices may be generally classified into a volatile memory device such as DRAM and SRAM, and a nonvolatile memory device such as EEPROM, FRAM, PRAM, MRAM, and a flash memory. The volatile memory devices lose data stored therein when power is cut off, while the nonvolatile memory devices retain data stored therein even when power is cut off. In particular, the flash memory may have advantages such as high programming speed, low power consumption, and large data storage. Accordingly, a memory system including the flash memory has been widely used as a data storage medium.

In general, a flash memory device may store bit information by injecting charges into a conductive floating gate blocked by an insulating film. However, due to a problem of capacitive coupling between memory cells or between a memory cell and a selection transistor, the structure of the conductive floating gate may have physical limitations on high integration. As an alternative to solve the problem of capacitive coupling between the conductive floating gates, the structure of a charge trap flash (CTF) memory using an insulating film such as $Si_3N_4$, $Al_2O_3$, HfAlO, or HfSiO as a charge storage layer instead of a conventional conductive floating gate has been proposed.

A charge trap flash memory device may also be applied to a 3D flash memory device having a three-dimensional structure to overcome physical limitations on high integration. Since the charge trap flash memory device has a structural characteristic of using an insulating film as the charge storage layer, electrons and holes in the charge storage layer may be rearranged/recombined after a program or erase operation, thereby changing threshold voltages of flash memory cells.

In addition, if the threshold voltages of the flash memory cells are changed due to a disturb phenomenon during a read operation, an uncorrectable error correction code (UECC) may occur in the read data.

SUMMARY

Some example embodiments of the inventive concepts provide a storage device that performs an efficient reclaim operation using machine learning.

Some example embodiments of the inventive concepts also provide a method for operating a storage device that performs an efficient reclaim operation using machine learning.

However, example embodiments of the present inventive concepts are not restricted to the ones set forth herein. The above and other example embodiments of the present inventive concepts will become more apparent to one of ordinary skill in the art to which the present inventive concepts pertain by referencing the detailed description of the present inventive concepts given below.

According to some example embodiments of the present inventive concepts, there is provided a storage device including a nonvolatile memory device including a first block and a second block, and a controller including processing circuitry configured to cause the controller to, predict a number of writes to be performed on the nonvolatile memory device using a machine learning model, determine a type of reclaim command based on the predicted number of writes, the reclaim command for reclaiming data of the first block to the second block, and issue the reclaim command.

According to some example embodiments of the present inventive concepts, there is provided a storage device including a nonvolatile memory device, a random access memory configured to store information transmitted to the nonvolatile memory device, and processing circuitry configured to perform machine learning based on the stored information in response to receiving a request for the nonvolatile memory device to perform a reclaim operation, predict a number of writes to be performed on the nonvolatile memory device through the machine learning, and determine a type of reclaim operation based on the predicted number of writes.

According to some example embodiments of the present inventive concepts, there is provided a storage device including a nonvolatile memory device including a first block and a second block, the first block including a first area; and a controller including a host interface configured to communicate with an external host device, a random access memory configured to receive and temporarily store information for machine learning, the information being received from the host interface, a memory interface configured to transmit a reclaim command to the nonvolatile memory device, the memory interface including an error correction block, processing circuitry configured to, in response to the first area including at least one uncorrectable ECC (UECC), cause the controller to, issue a command of reclaiming first data stored in the first area to the second block, predict a number of times second data is to be written in an area where the first data is not reclaimed in the second block by using machine learning, in response to the first data being reclaimed to the second block, issue a command of reclaiming the first data to the second block in response to the predicted number of writes being greater than a threshold value, and issues a command of reclaiming third data of the first block to the second block in response to the predicted number of writes being smaller than or equal to the threshold value, and a bus connecting the processing circuitry, the host interface, the random access memory, and the memory interface.

BRIEF DESCRIPTION OF THE DRAWINGS

The above and other example embodiments and features of the inventive concepts will become more apparent by describing in detail example embodiments thereof with reference to the attached drawings, in which.

Hereinafter, a description that overlaps with the above description is omitted.

DETAILED DESCRIPTION

Figure 1:
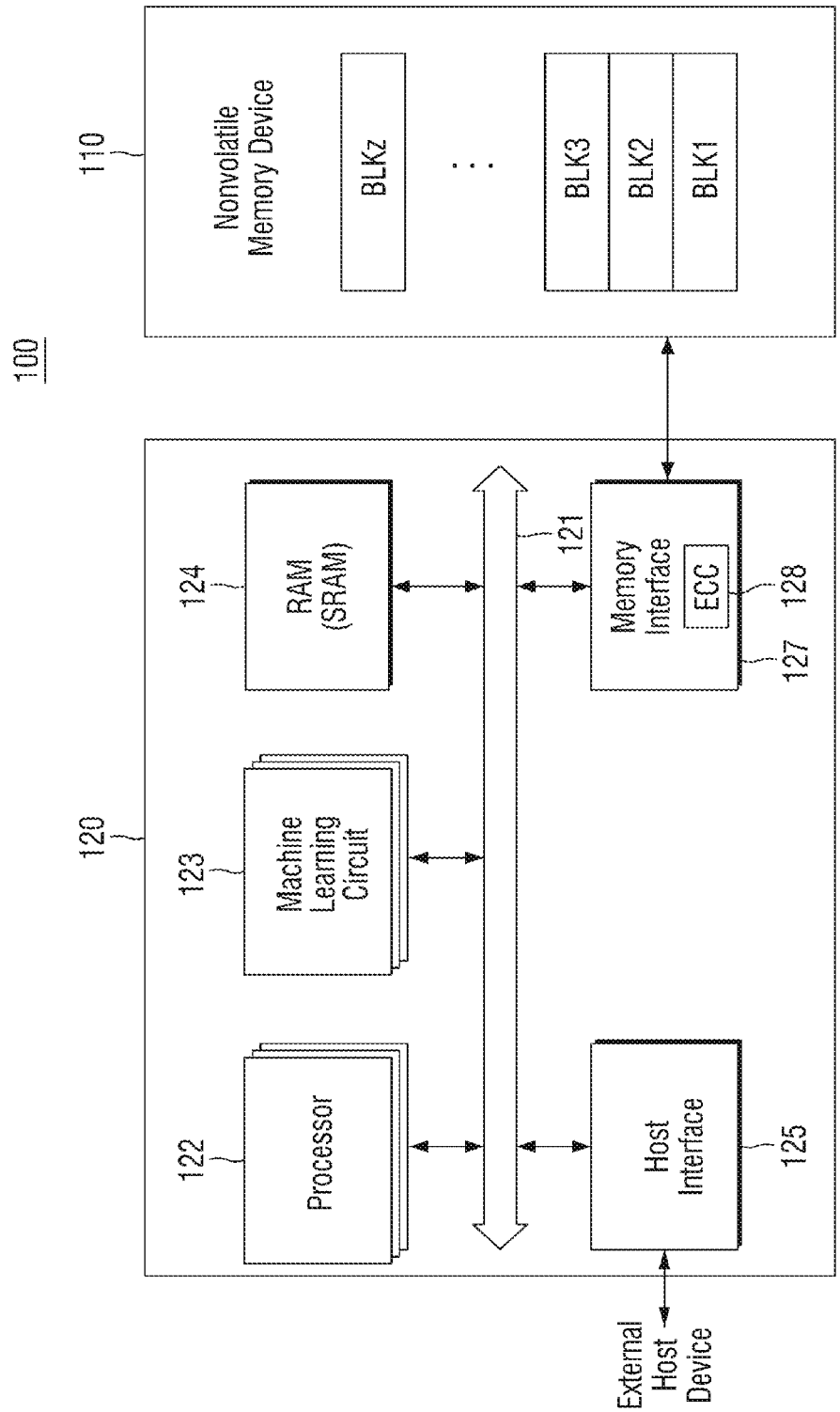
FIG. 1 is an example block diagram illustrating a storage device according to some example embodiments.
Figure 2:
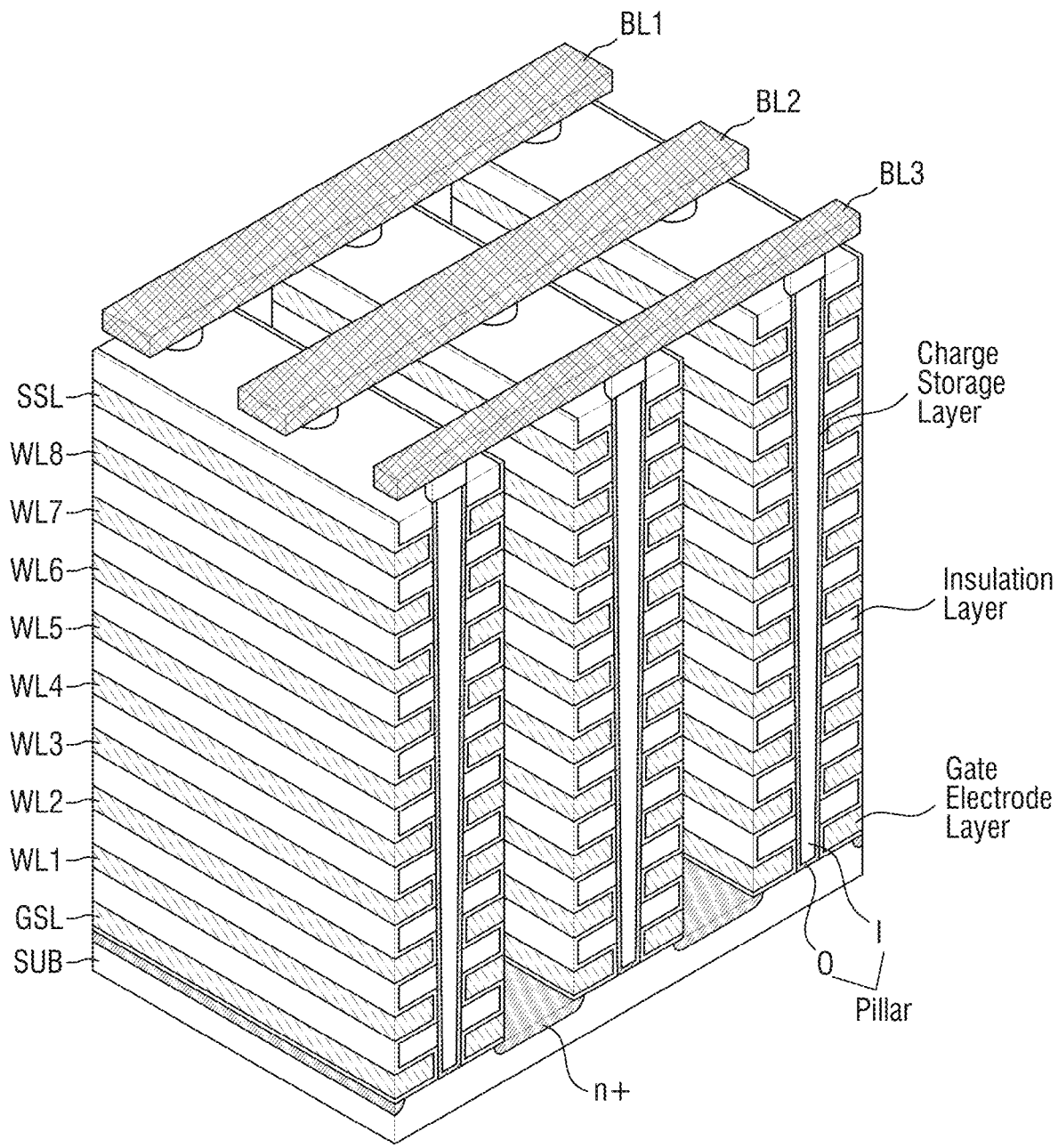
FIG. 2 is a perspective view showing a three-dimensional structure of a memory block shown in FIG. 1 according to some example embodiments.
Figure 3:
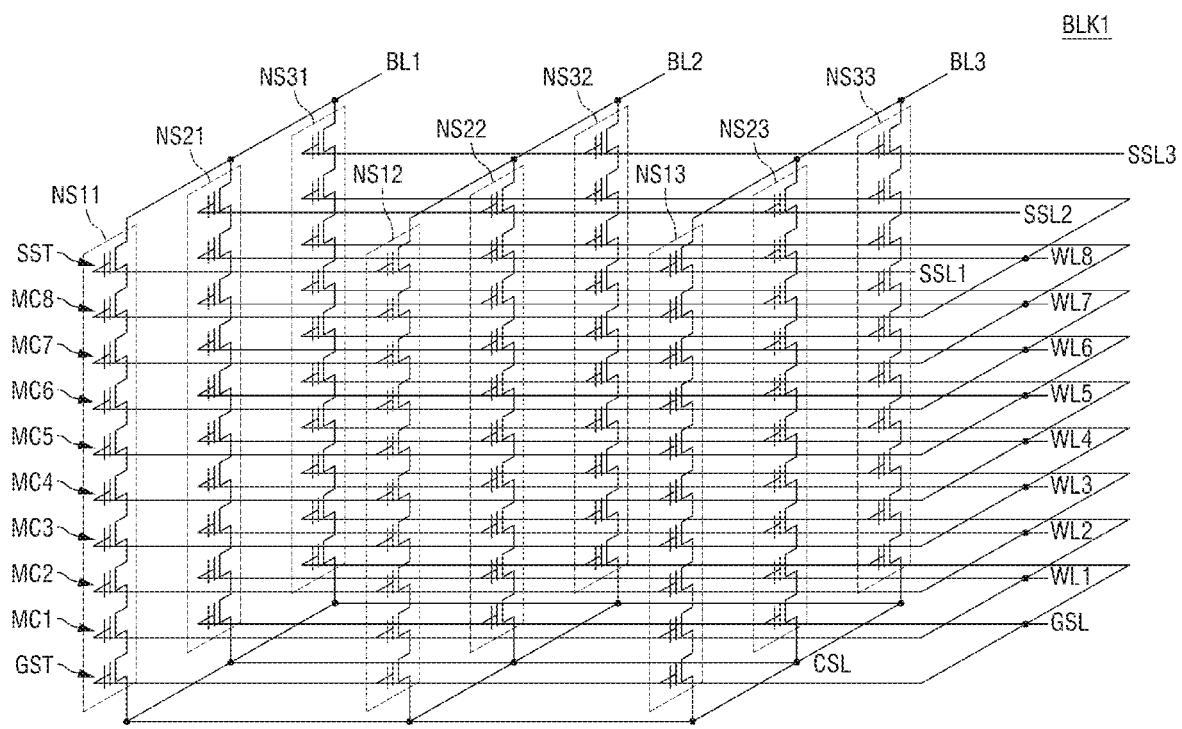
FIG. 3 is an example equivalent circuit diagram of the memory block shown in FIG. 2.

FIG. 1 is an example block diagram illustrating a storage device according to some example embodiments. FIG. 2 is a perspective view showing a three-dimensional structure of a memory block shown in FIG. 1 according to some example embodiments. FIG. 3 is an example equivalent circuit diagram of the memory block shown in FIG. 2.

Referring to FIG. 1, a storage device 100 according to some example embodiments includes a nonvolatile memory device 110 and a controller 120.

The nonvolatile memory device 110 according to some example embodiments may include a 3D flash memory. Alternatively, the nonvolatile memory device 110 may include a phase-change random access memory (PRAM), a ferroelectric random access memory (FeRAM), and a magnetic random access memory (MRAM), a resistive random access memory (RRAM), or the like.

The nonvolatile memory device 110 includes a plurality of memory blocks BLK1 to BLKz (hereinafter, also referred to as blocks for simplicity of description). The plurality of memory blocks BLK1 to BLKz may have a three-dimensional structure (or vertical structure). In a memory block having a two-dimensional structure (or horizontal structure), memory cells may be formed in a direction parallel to a substrate. However, in a memory block having a three-dimensional structure, memory cells may be formed in a direction perpendicular to a substrate. Each or one or more of the memory blocks BLK1 to BLKz may form an erase unit of the nonvolatile memory device 110.

The memory blocks of FIG. 1 according to some example embodiments will be described with reference to FIGS. 2 and 3 below. For simplicity of description, the first block BLK1 will be described as an example. The description of the first block BLK1 may also be applied to the other blocks BLK2 to BLKz.

Referring to FIG. 2, the first block BLK1 may be formed in a direction perpendicular to a substrate SUB. An N-type doped region n+ may be formed on the substrate SUB. A charge storage layer may be formed between a gate electrode layer and an insulation layer on the substrate SUB.

A pillar may be formed to penetrate the gate electrode layer and the insulation layer in a vertical direction. The pillar may pass through the gate electrode layer and the insulation layer to be connected to the substrate SUB. An outer portion O of the pillar may be composed of a channel semiconductor, and an inner portion I thereof may be composed of an insulating material such as silicon oxide.

The gate electrode layer of the first block BLK1 according to some example embodiments may be connected to a ground select line GSL, a plurality of word lines WL1 to WL8, and a string select line SSL. In addition, the pillar of the first block BLK1 may be connected to a plurality of bit lines BL1 to BL3. In FIG. 2, the first block BLK1 is illustrated as having two select lines GSL and SSL, eight word lines WL1 to WL8, and three bit lines BL1 to BL3, but it is not limited thereto and may have more or less lines.

Referring to FIG. 3, NAND strings NS11 to NS33 may be connected between the plurality of bit lines BL1 to BL3 and a common source line CSL. Each or one or more of the NAND strings (e.g., NS11) may include a string select transistor SST, a plurality of memory cells MC1 to MC8, and a ground select transistor GST.

The string select transistor SST may be connected to the string select line SSL. The plurality of memory cells MC1 to MC8 may be connected to corresponding word lines WL1 to WL8, respectively. In addition, the ground select transistor GST may be connected to the ground select line GSL. The string select transistor SST may be connected to each or one or more of the bit lines BL1 to BL3, and one end of the ground select transistor GST may be connected to the common source line CSL.

In the first block BLK1 according to some example embodiments, the word line (e.g., the first word line WL1) and the ground select line GSL at the same height are connected in common, and the string select lines SSL1, SSL2, and SSL3 may be separated from each other. Memory cells (hereinafter, also referred to as pages) connected to the first word line WL1 and belonging to the NAND strings NS11, NS12, and NS13 may be programmed by selecting the first word line WL1 and the first string select line SSL1.

At this time, the electrons and/or holes in the charge storage layer of FIG. 2 may be rearranged/recombined by repetitive program and erase operations on the first block BLK1, so that threshold voltages of the memory cells MC1 to MC8 in the first block BLK1 may be changed. In addition, due to a disturbance phenomenon during a read operation, the threshold voltages of the memory cells MC1 to MC8 in the first block BLK1 may be changed. Then, an uncorrectable error correction code (UECC) may occur in data after the read operation is performed. That is, the UECC may occur for various reasons, but typically, it may occur due to charge loss in the charge storage layer of FIG. 2.

The change in the threshold voltages of the memory cells MC1 to MC8 due to charge loss, which is one of the representative reasons for the occurrence of the UECC, will be described in detail with reference to FIGS. 4 and 5.

Figure 4:
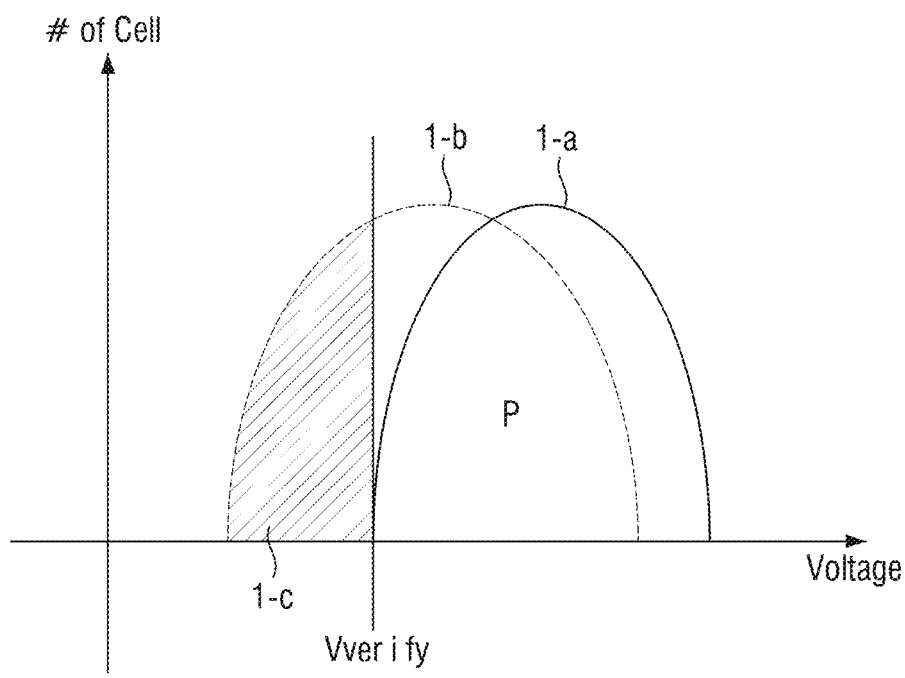
FIG. 4 is an example graph describing the charge loss of a single-level cell (SLC).

FIG. 4 is an example graph describing the charge loss of a single-level cell (SLC).

Referring to FIG. 4, a charge loss phenomenon means that electrons trapped in the charge storage layer of FIG. 2 partially escape from the charge storage layer over time. In addition, if the number of repetitions of the program and erase operations increases, a tunnel oxide layer may deteriorate, and thus, the charge loss phenomenon may occur more severely.

Specifically, an x-axis of FIG. 4 represents a voltage, and a y-axis of FIG. 4 represents the number of memory cells. A first program state distribution 1-a represents a program state distribution immediately after the program operation (e.g., a state having no charge loss), and a second program state distribution 1-b represents a program state distribution after the occurrence of the charge loss. That is, as the charge loss occurs, the first program state distribution 1-a moves to the second program state distribution 1-b. Therefore, the first program state distribution 1-a is located to the left of a verification voltage Vverify. If the number of nonvolatile memory cells corresponding to a partial distribution 1-c of the second program state distribution 1-b increases, the nonvolatile memory cells corresponding to the partial distribution 1-c may not be able to be corrected using an error correction code (ECC).

Figure 5:
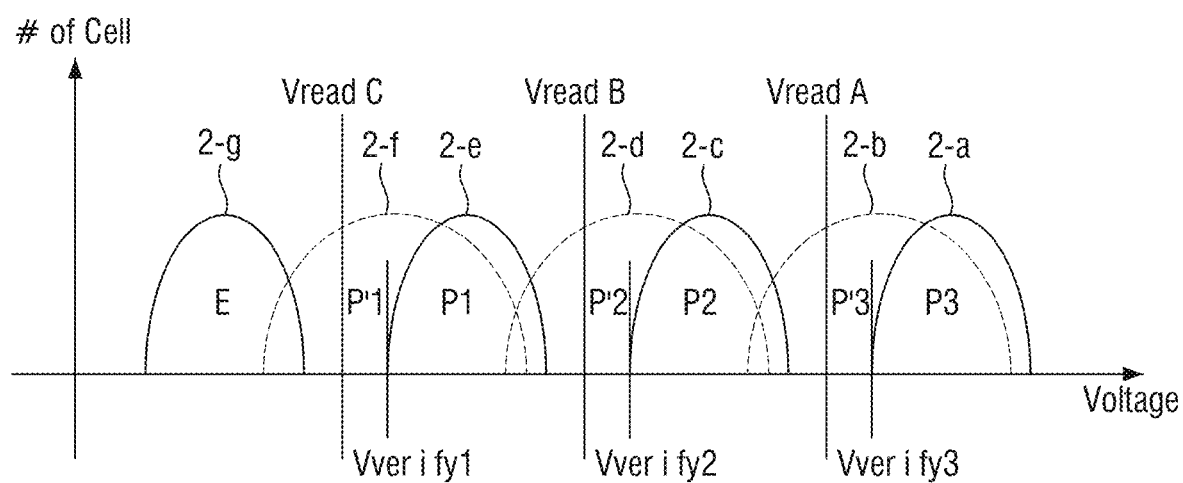
FIG. 5 is an example graph describing the charge loss of a multi-level cell (MLC).

FIG. 5 is an example graph describing the charge loss of a multi-level cell (MLC).

Referring to FIG. 5, in a nonvolatile memory device including a multi-level cell, in order to program k bits into one memory cell, any one of 2k threshold voltages should be formed in the memory cell. When 2 bits are stored in one cell, due to a slight difference in electrical characteristics between the memory cells, threshold voltages of memory cells programmed with the same data may form threshold voltage distributions in a certain range. Each or one or more threshold voltage distribution may correspond to each or one or more of 2k data values that may be generated by k bits.

More specifically, in the case of a 2-bit multi-level cell nonvolatile memory device, three program threshold voltage state distributions, P1 (2-e), P2 (2-c), and P3 (2-a), which are state distributions immediately after the program operation, are formed and a threshold voltage distribution 2-g of one erase state may be formed. In P1 (2-e), P2 (2-c), and P3 (2-a), voltage loss does not occur after programming, so the state distributions do not overlap with each other.

In a multi-level cell nonvolatile memory device according to some example embodiments, a read voltage may exist for each or one or more state distribution of the threshold voltage. Accordingly, in the case of the 2-bit multi-level cell nonvolatile memory device, a total of three read voltages may be determined as VreadA, VreadB, and VreadC. VreadA, VreadB, and VreadC may be default voltages predetermined (or alternately given) during fabricating, but are not limited thereto. In addition, for simplicity of description, the 2-bit multi-level cell nonvolatile memory device according to some example embodiments has been described in the drawing, but the present disclosure is not limited thereto. In the case of a 3-bit multi-level cell (triple level cell (TLC)), it may have 7 program distributions and 1 erase distribution.

When a time elapses after a program is executed in the 2 bit multi-level cell nonvolatile memory device according to some example embodiments, and when a time elapses by repeating program and erase operations, the threshold voltage distribution in the program state and erase state may be deformed due to the charge loss by deterioration of characteristics of the memory cell.

As illustrated in FIG. 4, even in the case of the 2-bit multi-level cell nonvolatile memory device of FIG. 5, as time passes, the charge loss which is the release of charges trapped in the charge storage layer of FIG. 2 may occur. In addition, the tunnel oxide layer may deteriorate while the program and erase operations are repeated, thereby further increasing the charge loss.

The above-described charge loss may reduce the threshold voltage of the memory cell. That is, the distribution of the threshold voltage in FIG. 5 may be shifted to the left in the graph. Accordingly, as illustrated in FIG. 5, threshold voltage distributions of adjacent states may overlap each other. For example, E (2-g) and P'1 (2-f) may overlap, P'1 (2-f) and P'2 (2-d) may overlap, and P'2 (2-d) and P'3 (2-b) may overlap each other. If the distributions overlap, many errors may be included in data read at the time of applying a specific read voltage.

For example, when applying VreadA to the nonvolatile memory device according to some example embodiments, data of P2 may be read in an on state and data of P3 may be read in an off state. However, if the overlapping portions between the distributions exist due to the charge loss, an error bit may be generated due to data of P'3 when the voltage VreadA is applied. When the number of error bits described above increases, the memory cell of the nonvolatile memory device may not be able to be corrected using the error correction code (ECC).

If the error bit level included in the read data cannot be corrected using an ECC block 128 of FIG. 1, an error called an uncorrectable ECC (UECC) is generated. Due to the property of a flash memory cell, if a long time passes after programming, the error bit level increases, and when more time passes, the UECC is generated.

A phenomenon in which the UECC is generated as described above may be referred to as a reduction in retention. In order to reduce or prevent the occurrence of the UECC, data from a memory block (source block) deteriorated by the retention reduction is moved in advance to a new fresh block (a destination block, a data-writable block) in a memory system, which is called reclaim. The fresh block may be a clean block that does not cause a disturbance phenomenon. A detailed description of the type and operation of the reclaim will be given in detail with reference to FIGS. 6 to 8 below.

Figure 6:
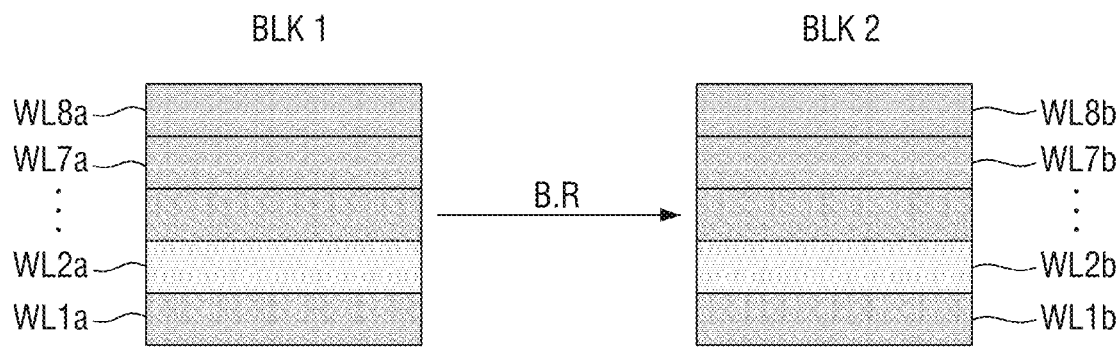
FIG. 6 is an example diagram describing a block reclaim operation of the storage device according to some example embodiments.
Figure 7:
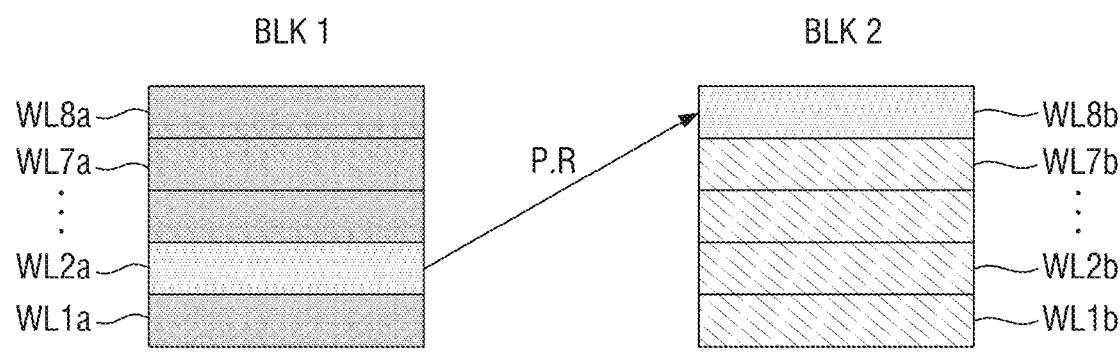
FIGS. 7 and 8 are example diagrams describing the partial reclaim operation of the storage device according to some example embodiments.
Figure 8:
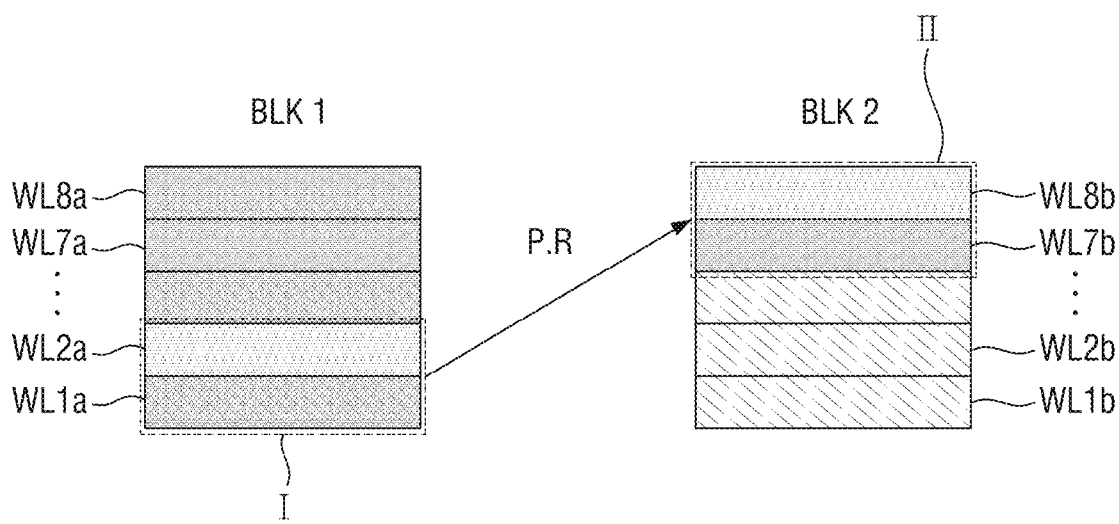

In FIGS. 6 to 8, a block in which the UECC has occurred is assumed as the first block BLK1, and the fresh block (a data-writable block or a destination block) is assumed as the second block BLK2. Each block is only an example, and it may also be applied to other blocks (BLK3 to BLKz).

FIG. 6 is an example diagram describing a block reclaim operation of the storage device according to some example embodiments.

Referring to FIG. 6, the first block BLK1 includes a plurality of word lines WL1a to WL8a. The second block BLK2 includes a plurality of word lines WL1b to WL8b. Incidentally, the number of word lines in the first block BLK1 and the second block BLK2 according to some example embodiments is not limited to that illustrated in the drawing.

The block reclaim operation according to some example embodiments writes the entire data of a block including data in which the UECC has occurred to a fresh block.

For example, it is assumed that the UECC has occurred in data written into a page connected to the second word line WL2a of the first block BLK1. In this case, a block reclaim (B.R), which refers to writing to the second block BLK2 the entire data of the first block BLK1 including the data in which the UECC has occurred, may be performed.

However, in the case of the block reclaim according to some example embodiments, even data having no UECC occurred in one block (e.g., first block BLK1) is all written to a new block (e.g., the second block BLK2). Therefore, a storage space of the storage device including the nonvolatile memory device according to some example embodiments may be reduced.

Further, a write may be performed exceeding the number of writes commanded by a host, thereby increasing a write amplification factor (WAF). The WAF is a value obtained by dividing the amount actually written to the nonvolatile memory device by the number of writes actually commanded by the host. The increase of the WAF means an increase in the amount of writes, which may deteriorate the performance of the storage device according to some example embodiments.

In order to solve the above-described block reclaim problem, a partial reclaim (P.R), which refers to transmitting only a part of the block (e.g., the first block BLK1) including data in which the UECC has occurred to the fresh block (e.g., the second block BLK2), may be performed. The partial reclaim will be described in detail with reference to FIGS. 7 and 8 below.

FIGS. 7 and 8 are example diagrams describing the partial reclaim operation of the storage device according to some example embodiments.

First, referring to FIG. 7, the partial reclaim may be performed by writing only data in which the UECC has occurred into a fresh block.

For example, it is assumed that the UECC has occurred in data written into a page of the second word line WL2a of the first block BLK1. In this case, data of the second word line WL2a where the UECC has occurred may be written to the eighth word line WL8b of the second block BLK2. That is, the data in which the UECC has occurred may be written to an uppermost page of the fresh block, but the partial reclaim according to some example embodiments is not limited thereto. For example, the data of the second word line WL2a of the first block BLK1 in which the UECC has occurred may be written into the seventh word line WL7b of the second block BLK2.

As another example, referring to FIG. 8, the partial reclaim (P.R) may be performed by writing a portion of a block including data (or page) in which the UECC has occurred into a fresh block.

For example, it is assumed that the UECC has occurred in data written into a page of the second word line WL2a of the first block BLK1. In this case, a first area I including data of the second word line WL2a where the UECC has occurred and the first word line WL1a may be written into a second area II of the second block BLK2. More specifically, the second word line WL2a where the UECC has occurred may be written into the eighth word line WL8b of the second block, and the first word line WL1a may be written into the seventh word line WL7b of the second block.

The partial reclaims according to some example embodiments are not limited thereto. That is, the first area I including the UECC data may be wider or narrower than that of FIG. 8, and the second area II of the second block BLK2 into which the first area I is written may be different from that of FIG. 8.

However, in the case of the above-described partial reclaims, after the partial reclaim, if data is not recorded, within a predetermined (or alternately given) period of time, into portions having no data written in the fresh block that has been subjected to the partial reclaim, the entire function of the fresh block may deteriorate. The above-mentioned predetermined (or alternately given) time period may be, for example, a time interval (erase program interval (EPI)) between the erase operation and the program operation of the nonvolatile memory device according to some example embodiments.

For example, after the partial reclaim in FIG. 7, if data is not recorded for the predetermined (or alternately given) period of time into the first word line WL1b to the seventh word line WL7b having no data written in the second block BLK2, the function of the entire second block BLK2 may deteriorate.

As another example, after the partial reclaim in FIG. 8, if data is not recorded for the predetermined (or alternately given) period of time into the first word line WL1b to the sixth word line having no data written in the second block BLK2, the function of the entire second block BLK2 may deteriorate.

The deterioration of the fresh block due to the above-described partial reclaim may have more serious results than deterioration in the performance of the storage device due to an increase in WAF by the block reclaim.

Accordingly, in the storage device according to some example embodiments, a type of the reclaim operation may be selected depending on a situation to improve the operational efficiency of the storage device.

More specifically, the storage device according to some example embodiments may predict the number of writes into pages (or areas), having no data written, of a fresh block through machine learning. The storage device according to some example embodiments may compare the predicted number of writes to a threshold value. If the predicted number of writes is greater than the threshold value, the partial reclaim may be performed and if the predicted number of writes is smaller than or equal to the threshold value, the block reclaim may be performed.

That is, the number of writes into areas, having no data written, of the fresh block is predicted, and the predicted number of writes is compared to a predefined threshold value. If it is determined that the predicted number of writes does not degrade the fresh block, the partial reclaim may be performed. On the other hand, as a result of comparing the predicted number of writes to the predefined threshold value, if it is determined that the predicted number of writes is small enough to degrade the fresh block, the block reclaim may be performed.

The above-described configuration and operation of the storage device according to some example embodiments will be described again with reference to FIG. 1.

Referring back to FIG. 1, the nonvolatile memory device 110 may perform a write operation, a read operation, an erase operation, and/or a reclaim operation under the control of the controller 120. The nonvolatile memory device 110 may receive a write command, an address, and data from the controller 120 and write the data into a storage space identified by the address. The nonvolatile memory device 110 may receive a read command and an address from the controller 120, may read data from a storage space identified by the address, and may output the read data to the controller 120.

The nonvolatile memory device 110 may receive an erase command and an address from the controller 120 to erase data in a storage space identified by the address. In addition, the nonvolatile memory device 110 receives a reclaim command from the controller 120 to perform the block reclaim or the partial reclaim in response to the reclaim command received from the controller 120.

A random access memory (RAM) 124 may temporarily store write and/or read commands received from an external host device. The RAM 124 may be, for example, a static random access memory (SRAM). The RAM 124 may further store meta data for the controller 120 to manage the nonvolatile memory device 110.

The RAM 124 may store access environment information and access result information when the external host device accesses the nonvolatile memory device 110. The information stored in the random access memory 124 may be used in machine learning performed by a machine learning circuit 123. For example, the machine learning circuit 123 may perform the machine learning based on the access environment information and the access result information associated with two or more accesses. The machine learning circuit 123 may select a method of the next access, whether to perform the next access or not, access parameters, and the like based on the result of the machine learning. The machine learning circuit 123 may include a memory storing a machine learning model. The machine learning circuit may include processing circuitry such as hardware including logic circuits; a hardware/software combination such as a processor executing software; or a combination thereof, configured to execute the machine learning model. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), a neuromorphic chip, etc.

Processors 122 may be used to manage the storage device 100. The processors 122 may control various operations of the controller 120 and perform logical operations. In one embodiment, the processors 122 may be configured to execute the machine learning model stored on the machine learning circuit 123. The processor 122 may communicate with the external host device through a host interface 125. The processors 122 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The host interface 125 may be configured to communicate with the external host device under the control of the processor 122. The host interface 125 may be configured to communicate using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

Further, the processors 122 may communicate with the nonvolatile memory device through a memory interface 127.

The processor 122 may control the storage device 100 using the RAM 124 as an operation memory, a cache memory, or a buffer memory.

The memory interface 127 may communicate commands, addresses, and data with the nonvolatile memory device 110 through an input/output channel. The memory interface 127 may communicate a control signal with the nonvolatile memory device 110 through a control channel.

In addition, the memory interface 127 may include an error correction block 128. The error correction block 128 may include an error correction code (ECC). The error correction block 128 may perform an error correction. The error correction block 128 may perform an error correction encoding on data to be written to the nonvolatile memory device 110 through the memory interface 127. The error-correction-encoded data may be transferred to the nonvolatile memory device 110 through the memory interface 127. The error correction block 128 may perform an error correction decoding on data received from the nonvolatile memory device 110 through the memory interface 127.

At this time, memory cells including the disturbance phenomenon as described with reference to FIGS. 4 and 5 increase, and thus data having an error unable to be corrected by the error correction block 128 may occur. For a memory cell having an error that cannot be corrected even through the error correction block 128, it may be said that the UECC has occurred. A detailed description of the UECC will be omitted because it is redundant.

The processor 122 may request the machine learning circuit 123 to predict a result associated with at least some of the accesses requested by the external host device or the accesses generated by an internal policy. More specifically, the processor 122 may request the machine learning circuit 123 to predict the number of writes into the nonvolatile memory device 110 for a predetermined (or alternately given) period of time (e.g., EPI time). The number of writes may be for an area, having no data written, of the fresh block after the partial reclaim is performed on the fresh block of the nonvolatile memory device 110.

A bus 121 may provide a channel between all components of the controller 120.

The configuration and operation of the machine learning circuit 123 will be described in detail with reference to FIG. 9 below.

Figure 9:
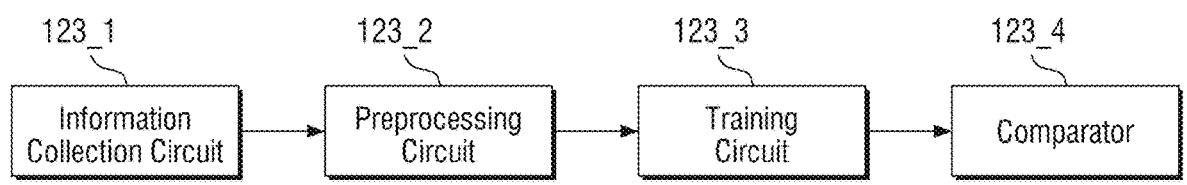
FIG. 9 is an example block diagram illustrating the machine learning circuit of the storage device according to some example embodiments.

FIG. 9 is an example block diagram illustrating the machine learning circuit of the storage device according to some example embodiments.

Referring to FIGS. 1 and 9, the machine learning circuit 123 includes an information collection circuit 123_1, a preprocessing circuit 123_2, a training circuit 123_3, and a comparator 123_4.

The information collection circuit 123_1 may collect access result information generated when the external host device accesses the nonvolatile memory device 110 through the controller 120. For example, the access result information may be information related to a write operation and/or a read operation transferred from the external host device to the nonvolatile memory device 110 through the controller 120. An example of the access result information will be described with reference to FIG. 10.

Figure 10:
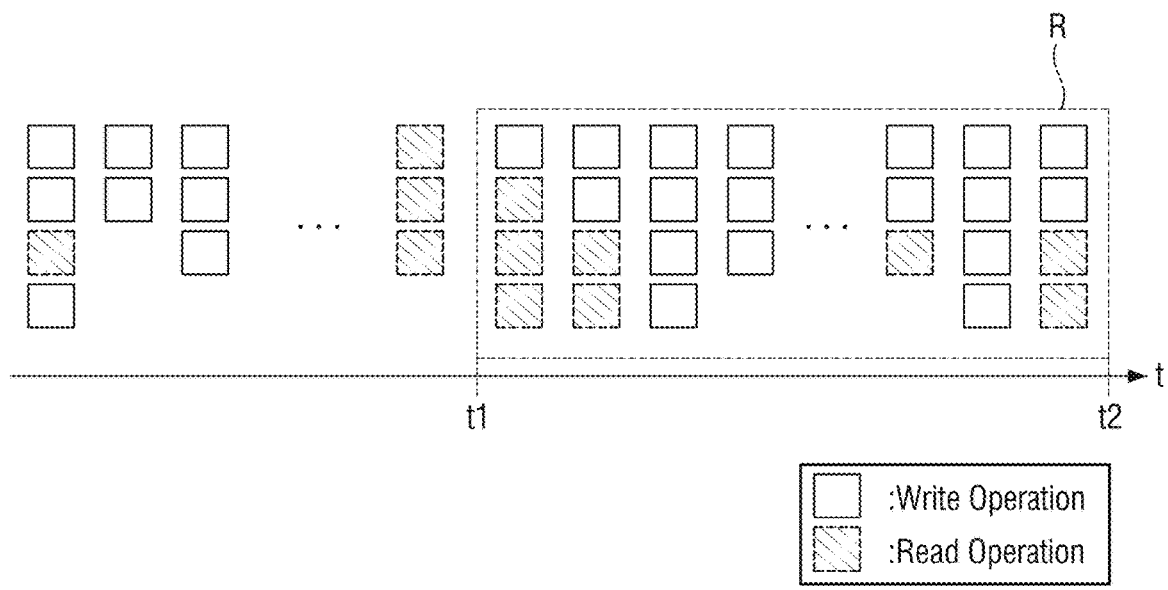
FIG. 10 is an example diagram explaining an operation of the information collection circuit that collects information and an operation of the preprocessing circuit that preprocesses the collected information, in the machine learning circuit according to some example embodiments.

FIG. 10 is an example diagram explaining an operation of the information collection circuit that collects information and an operation of the preprocessing circuit that pre-processes the collected information, in the machine learning circuit according to some example embodiments.

Referring to FIGS. 1, 9 and 10, the access result information, on a write operation and a read operation, generated when the external host device accesses the nonvolatile memory device 110 through the controller 120 may be stored in a storage space (e.g., the RAM 124) over time.

The information collection circuit 123_1 may collect the access result information on the read operation and the write operation from the storage space such as the RAM 124.

Referring back to FIGS. 1 and 9, the preprocessing circuit 123_2 may receive the access result information collected by the information collection circuit 123_1 and pre-process it as learning data for the machine learning.

Referring back to FIGS. 1, 9 and 10 in more detail, the preprocessing circuit 123_2 may pre-process the access result information to generate learning data such as a ratio of the read operation to the write operation and an interval between the read operation and the write operation.

In detail, the processor 122 may determine that reclaim is warranted, and transmit a request to the machine learning circuit 123 to determine the type of the reclaim operation recommended for efficient operation of some storage devices.

Then, the preprocessing circuit 123_2 may arbitrarily set a section R up to a time point (e.g., a first time point t1) earlier than a time point (e.g., a second time point t2) at which the request has been transmitted, and may pre-process the access result information within the section R to generate learning data (e.g., a ratio of the read operation to the write operation and/or an interval between the read operation and the write operation) for the machine learning.

Referring back to FIGS. 1 and 9, the training circuit 123_3 may predict the number of writes through the machine learning using the learning data generated by the preprocessing circuit 123_2.

A model that may be generated by the training circuit 123_3 through the machine learning will be described below with reference to FIGS. 11 to 13.

Figure 11:
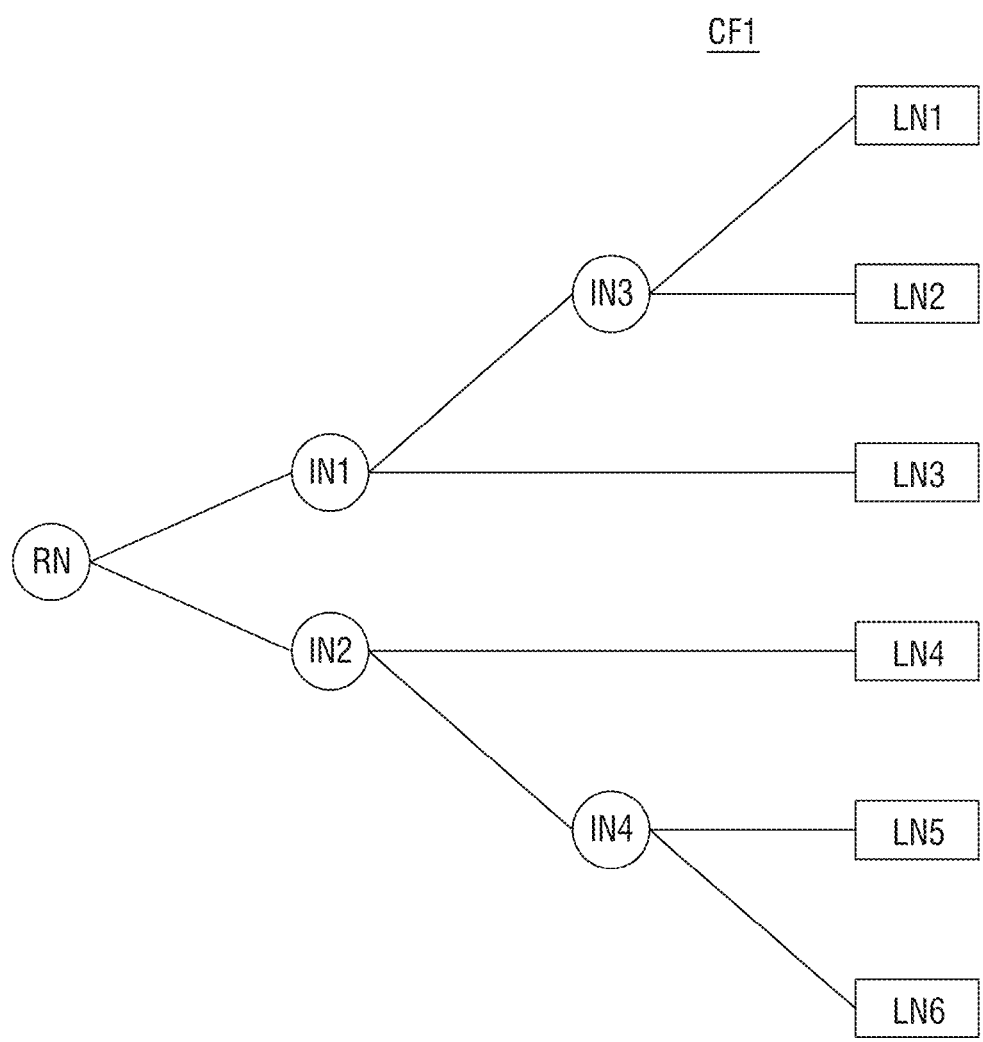
FIGS. 11 to 13 are example diagrams describing a model used by the training circuit of the machine learning circuit according to some example embodiments.
Figure 12:
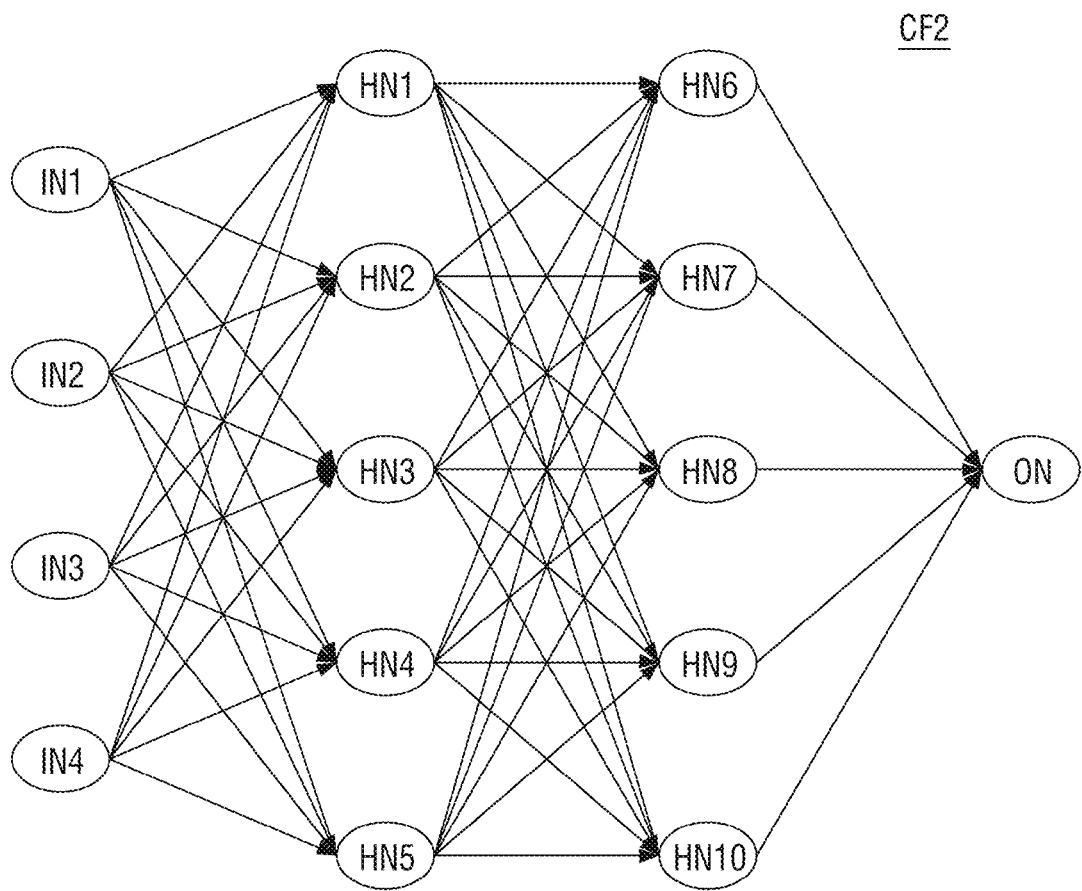
Figure 13:
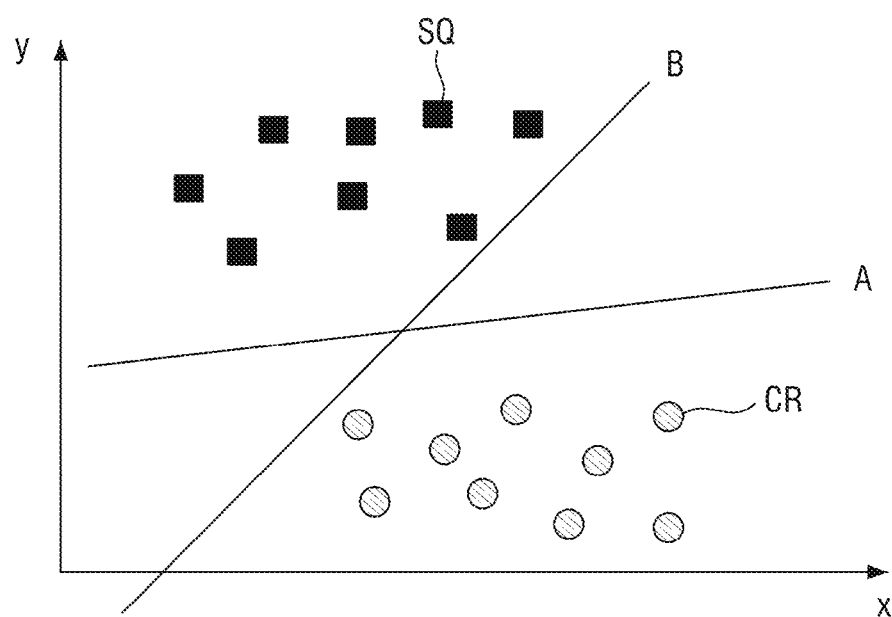

FIGS. 11 to 13 are example diagrams describing a model used by the training circuit of the machine learning circuit according to some example embodiments.

Referring to FIGS. 1, 9 and 11, a first model CF1 that may be generated through the machine learning may be a decision tree.

The first model CF1 may include a root node RN, first to fourth internal nodes IN1 to IN4, and first to sixth leaf nodes LN1 to LN6. The root node RN, the first to fourth internal nodes IN1 to IN4, and the first to sixth leaf nodes LN1 to LN6 may be respectively connected through branches.

In each or one or more of the root node RN and the first to fourth internal nodes IN1 to IN4, comparison to one of the access result information may be performed. According to the comparison result, one of the plurality of branches connected to each or one or more node may be selected. If the selected branch is connected to another internal node, comparison to another one of the access result information may be performed at the internal node. If the selected branch is connected to the leaf node, the value of the leaf node may be obtained as a classification result.

For example, upon receiving the access result information from the root node RN, the number of writes to be performed on the nonvolatile memory device 110 during a predetermined (or alternately given) period of time (e.g., EPI) may be predicted.

When the storage device 100 according to some example embodiments is sold after fabricating it, the first model CF1 may have already been mounted on the storage device 100. For example, the first model CF1 may be generated by a manufacturer of the storage device 100 based on the access result information collected from multiple users. The first model CF1 may be considered to have been generated by 'off-line' learning from a viewpoint that it is generated by information already collected.

While the storage device 100 according to some example embodiments is sold and used by a user, the first model CF1 may be continuously updated by the access result information of the user. Updating the first model CF1 may be performed by the machine learning that updates a comparison value to which the access result information is compared at each or one or more of the root node RN and the first to fourth internal nodes IN1 to IN4. The first model CF1 may be considered to have been generated by "on-line" learning from a viewpoint that it is updated using real-time access result information of the user after the storage device 100 is sold.

Referring to FIGS. 1, 9 and 12, a second model CF2 that may be generated through the machine learning may be a neural network.

The second model CF2 may include first to fourth input nodes IN1 to IN4, first to tenth hidden nodes HN1 to HN10, and an output node ON. The number of input nodes, the number of hidden nodes, and the number of output nodes may be determined in advance when implementing the neural network.

The first to fourth input nodes IN1 to IN4 may form an input layer. The first to fifth hidden nodes HN1 to HN5 may form a first hidden layer. The sixth to tenth hidden nodes HN6 to HN10 may form a second hidden layer. The output node ON may form an output layer. The number of hidden layers may be determined in advance when constructing the neural network.

The access result information may be input to the first to fourth input nodes IN1 to IN4. Different types of access result information may be input to different input nodes. The access result information of each or one or more input node may be delivered, with weights, to the first to fifth hidden nodes HN1 to HN5 of the first hidden layer. Each or one or more input of the first to fifth hidden nodes HN1 to HN5 may be delivered, with weights, to the sixth to tenth hidden nodes HN6 to HN10 of the second hidden layer. The inputs of the sixth to tenth hidden nodes HN6 to HN10 may be delivered to the output node ON, with weights.

The machine learning may be performed by repeating updating the weights according to the difference between the value of the output node ON obtained when the access result information is input to the first to fourth input nodes IN1 to IN4 and the access result information obtained when an actual access is performed.

The second model CF2 based on the neural network may be generated by the off-line learning and mounted on the storage device 100. As the user uses the storage device 100, the second model CF2 based on the neural network may be updated by the on-line learning.

Referring to FIGS. 1, 9 and 13, a third model CF3 that may be generated through the machine learning may be a support vector machine.

In some example embodiments, a horizontal axis x and a vertical axis y of the third model CF3 each indicate learning data. The shapes (square and circle) of samples distributed in the third model CF3 according to some example embodiments may indicate different access result information.

A line 'A' and a line 'B' may be used to classify the square samples SQ and the circular samples CR. However, considering the probability of samples subsequently collected, the 'A' line may have a larger margin than the 'B' line. The third model CF3 may select a classification criterion having a larger margin, such as the line 'A'. The third model CF3 may have an initial classification criterion through the off-line learning. As a user uses the storage device 100, the number of samples increases, and the third model CF3 may update the classification criterion through the on-line learning.

Models used for the machine learning by the storage device 100 according to some example embodiments are not limited to the above-described models, and recurrent neural networks (RNN), long short-term memory models (LSTM), and generative adversarial nets (GAN), a variational auto encoder (VAE), a regression model, and the like may be used.

Referring back to FIGS. 1 and 9, the comparator 123_4 compares the number of writes predicted by the training circuit 123_3 to a randomly designated threshold.

In more detail, the comparator 123_4 may compare the number of writes predicted by the training circuit 123_3 to the randomly designated threshold to determine the type of the reclaim operation of the storage device according to some example embodiments.

The threshold may be a value of the number of writes required for an area having no data written in the fresh block so as not to degrade the fresh block described with reference to FIGS. 6 to 8. That is, based on the threshold, it is possible to determine the type of the reclaim operation that is more efficient for the storage device 100.

For example, when the number of writes is predicted to be greater than the threshold, it may be determined that performing the partial reclaim is more efficient for the storage device 100. In addition, when the number of writes is predicted to be smaller than or equal to the threshold, it may be determined that performing the block reclaim is more efficient for the storage device 100.

The comparator 123_4 may command the nonvolatile memory device 110 to perform the partial reclaim or the block reclaim based on the result of the above-described determination.

Figure 14:
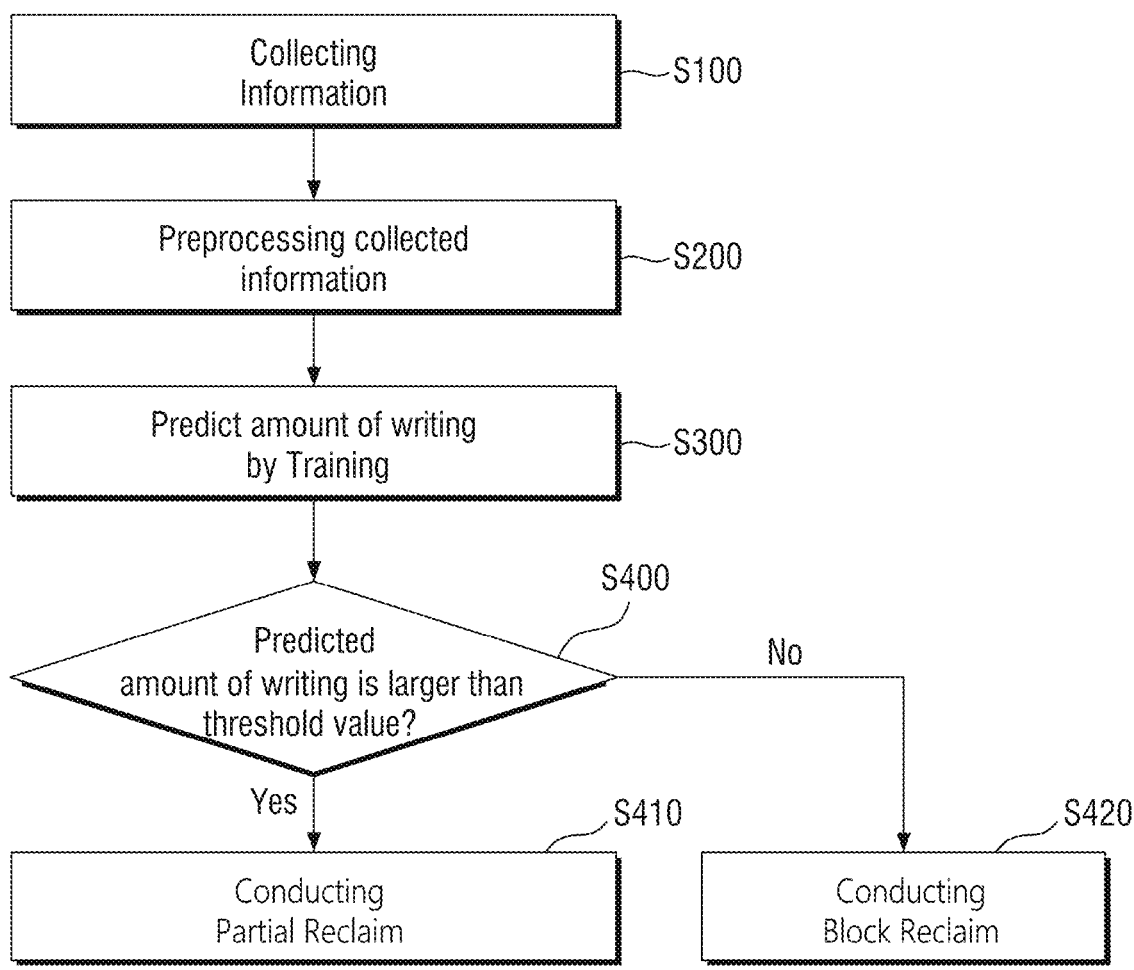
FIG. 14 is an example flowchart describing a method for operating the storage device according to some example embodiments.

FIG. 14 is an example flowchart describing a method for operating the storage device according to some example embodiments. A description overlapping with that of FIG. 9 is omitted for the sake of simplicity.

Referring to FIGS. 1, 9, and 14, first, information (e.g., access result information associated with a write operation and/or a read operation) for the machine learning is collected by the information collection circuit 123_1 (step S100).

Then, the collected information is pre-processed by the preprocessing circuit 123_2 (step S200). More specifically, the preprocessing circuit 123_2 pre-processes the access result information to generate learning data (e.g., a ratio between the read operation and the write operation and/or an interval between the read operation and the write operation) for the machine learning.

Subsequently, the number of writes to be performed on the nonvolatile memory device 110 is predicted by the training circuit 123_3 through the machine learning using the pre-processed data (step S300).

Thereafter, the predicted number of writes is compared to a threshold by the comparator 123_4 to determine whether the predicted number of writes is greater than the threshold or not (step S400).

The threshold may be a value of the number of writes required for an area having no data written in the fresh block so as not to degrade the fresh block described with reference to FIGS. 6 to 8. That is, based on the threshold, it is possible to determine the type of the reclaim operation that is more efficient for the storage device 100.

If it is determined that the predicted number of writes is greater than the threshold (Yes in step S400), the comparator 123_4 or the machine learning circuit 123 commands the nonvolatile memory device 110 to perform the partial reclaim (step S410).

On the other hand, if it is determined that the predicted number of writes is smaller than or equal to the threshold (No in step S400), the comparator 123_4 or the machine learning circuit 123 commands the nonvolatile memory device 110 to perform the block reclaim (step S420).

Figure 15:
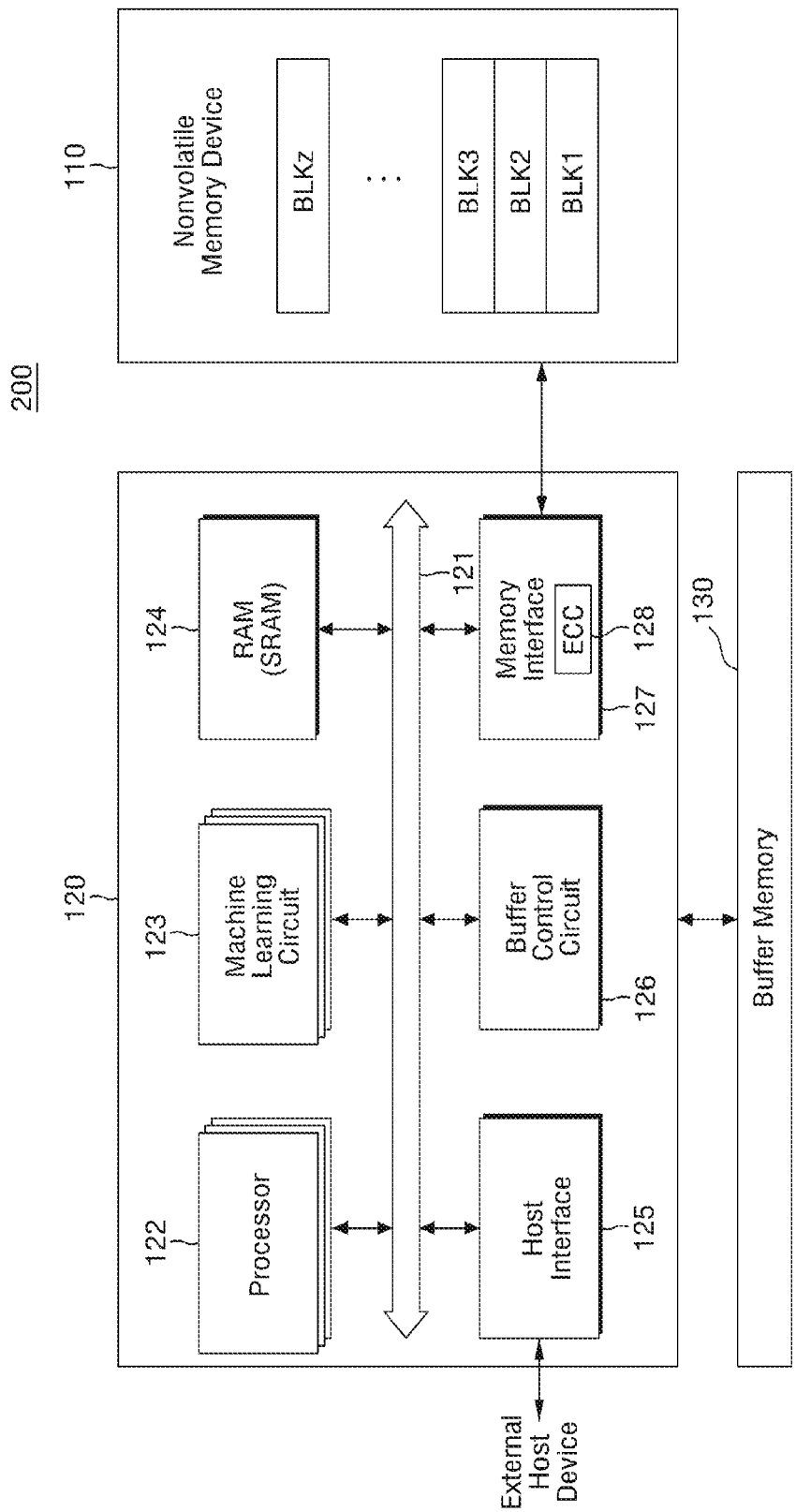
FIGS. 15 to 17 are example block diagrams describing the storage device according to some example embodiments.
Figure 16:
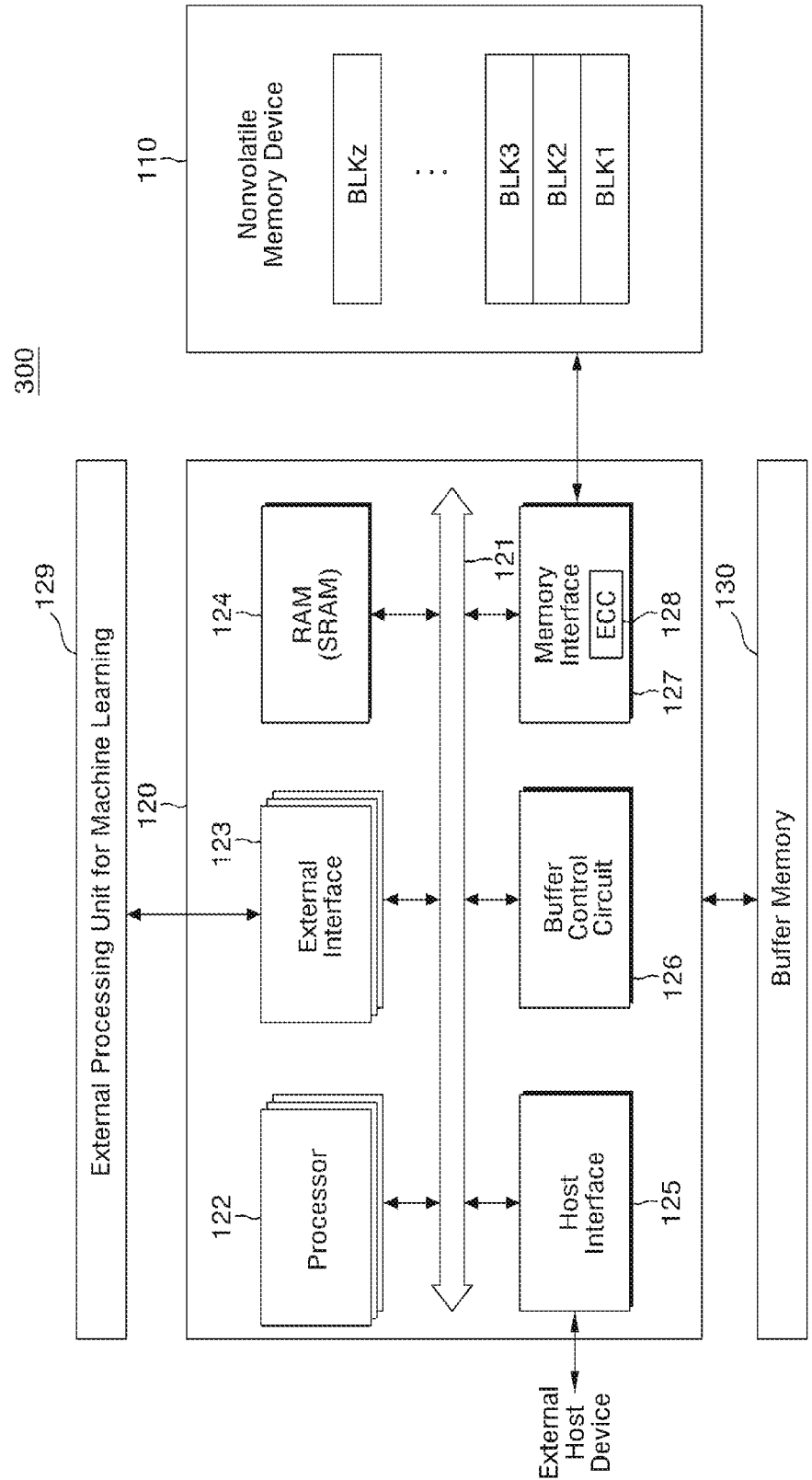
Figure 17:
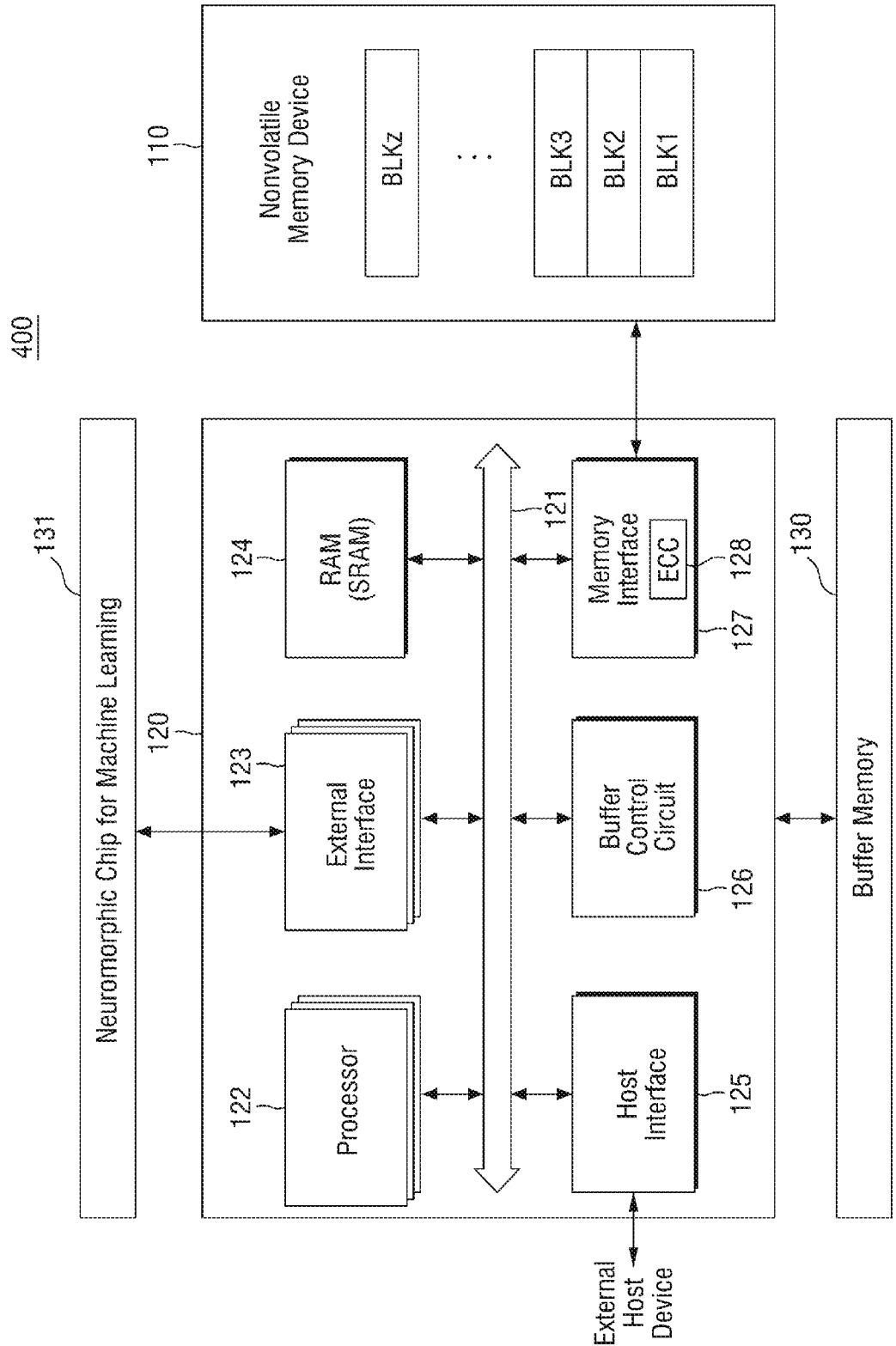

FIGS. 15 to 17 are example block diagrams describing the storage device according to some example embodiments. Hereinafter, a description that overlaps with the above description is omitted.

Referring to FIG. 15, unlike the storage device 100 of FIG. 1 according to some example embodiments, a storage device 200 further includes a buffer memory 130, and the controller 120 of the storage device 200 further includes a buffer control circuit 126.

The buffer control circuit 126 is configured to control the buffer memory 130 under the control of the processor 122.

The buffer memory 130 may temporarily store write and/or read commands received from the external host device. The buffer memory 130 may be, for example, a DRAM or SRAM.

The buffer memory 130 may store the access environment information and the access result information when the external host device accesses the nonvolatile memory device 110. The information stored in the buffer memory 130 may be used in the machine learning performed by the machine learning circuit 123. For example, the machine learning circuit 123 may perform the machine learning based on the access environment information and the access result information associated with two or more accesses. The machine learning circuit 123 may select a method of the next access, whether to perform the next access or not, access parameters, and the like based on the result of the machine learning.

Referring to FIG. 16, unlike the storage device 200 of FIG. 15 according to some example embodiments, a storage device 300 further includes an external processing unit 129 for machine learning. In addition, unlike the storage device 200 of FIG. 15, the controller 120 of the storage device 300 includes an external interface 123 instead of the machine learning circuit 123. Optionally, the buffer memory 130 and the buffer control circuit 126 of the storage device 300 may be omitted.

The external processing unit 129 for machine learning may be a micro processing unit (MPU) or a graphic processing unit (GPU).

The processor 122 may request the external processing unit 129 to perform the machine learning, through the external interface 123. In addition, the processor 122 may request the external processing unit 129 to predict the number of writes, through the external interface 123.

Referring to FIG. 17, a storage device 400 includes a neuromorphic chip 131 for machine learning, instead of the external processing unit 129 for machine learning of the storage device 300 of FIG. 16 according to some example embodiments.

The neuromorphic chip 131 is a processor that mimics a brain's operation manner and processes large-scale parallel operations with low power. The neuromorphic chip 131 may perform an improved or optimized operation for machine learning, compared to other processors, by processing in parallel a number of models described in FIGS. 11 to 13.

The processor 122 may request the neuromorphic chip 131 to perform the machine learning, through the external interface 123. In addition, the processor 122 may request the neuromorphic chip 131 to predict the number of writes, through the external interface 123.

In concluding the detailed description, those skilled in the art will appreciate that many variations and modifications may be made to the example embodiments without substantially departing from the principles of the present inventive concepts. Therefore, the disclosed example embodiments of the invention are used in a generic and descriptive sense only and not for purposes of limitation.

What is claimed is:

1. A storage device comprising:
a nonvolatile memory device including a first block and a second block; and
a controller including processing circuitry configured to cause the controller to,
predict a number of writes to be performed on the nonvolatile memory device using a machine learning model, the number of writes being a number of writes predicted to be performed in an erase program interval (EPI) between an erase operation and a program operation of the nonvolatile memory device,
determine a type of reclaim command based on the predicted number of writes, the reclaim command for reclaiming data of the first block to the second block, and
issue the reclaim command.

2. The storage device of claim 1, wherein, in response to the predicted number of writes being greater than a threshold value, the processing circuitry is configured to cause the controller to determine the type of the reclaim command as a partial reclaim.

3. The storage device of claim 2, wherein, in response to the predicted number of writes being less than or equal to the threshold value, the processing circuitry is configured to cause the controller to determine the type of the reclaim command as a block reclaim.

4. The storage device of claim 1, wherein the processing circuitry is configured to cause the controller to predict the number of writes for the second block based on a number of writes between a first time point of issuing the reclaim command and a second time point earlier than the first time point.

5. The storage device of claim 1, wherein the controller includes a comparator configured to compare the predicted number of writes with a threshold value, and
wherein the number of writes is the number of writes for an area where a reclaim is not performed in the second block.

6. The storage device of claim 1, wherein the processing circuitry is configured to cause the controller to,
collect external information from sources external to the storage device, and
preprocess the collected external information.

7. The storage device of claim 6, wherein the processing circuitry is configured to cause the controller to,
predict the number of writes using the machine learning model trained based on the preprocessed information, and
wherein the machine learning model includes at least one of recurrent neural networks (RNN), long short-term memory models (LSTM), generative adversarial nets (GAN), a variational auto encoder (VAE), or a regression model.

8. The storage device of claim 1, further comprising:
a buffer memory configured to communicate with the controller and store information for the machine learning model.

9. A storage device comprising:
a nonvolatile memory device;
a random access memory configured to store information transmitted to the nonvolatile memory device; and
processing circuitry configured to,
perform machine learning based on the stored information in response to receiving a request for the nonvolatile memory device to perform a reclaim operation,
predict a number of writes to be performed on the nonvolatile memory device through the machine learning, the number of writes being a number of writes predicted to be performed in an erase program interval (EPI) between an erase operation and a program operation of the nonvolatile memory device, and
determine a type of reclaim operation based on the predicted number of writes.

10. The storage device of claim 9, wherein, in response to the predicted number of writes being greater than a threshold value, the processing circuitry is configured to determine the type of reclaim operation as a partial reclaim operation.

11. The storage device of claim 10, wherein, in response to the predicted number of writes being smaller than or equal to the threshold value, the processing circuitry is configured to determine the type of reclaim operation as a block reclaim operation.

12. The storage device of claim 9, wherein the processing circuitry is configured to predict the number of writes based on a number of writes between a first time point of issuing a command to perform the reclaim operation and a second time point earlier than the first time point.

13. The storage device of claim 9, wherein the processing circuitry is configured to,
collect external information from sources external to the storage device, and
preprocess the collected information.

14. The storage device of claim 9, further comprising:
a buffer memory configured to communicate with the processing circuitry and store information for the machine learning.

15. A storage device comprising:
a nonvolatile memory device including a first block and a second block, the first block including a first area; and
a controller including,
a host interface configured to communicate with an external host device,
a random access memory configured to receive and temporarily store information for machine learning, the information being received from the host interface,
a memory interface configured to transmit a reclaim command to the nonvolatile memory device, the memory interface including an error correction block,
processing circuitry configured to, in response to first area including at least one uncorrectable ECC (UECC) page, cause the controller to,
issue a command of reclaiming first data stored in the first area to the second block,
predict a number of times second data is to be written in an area where the first data is not reclaimed in the second block by using machine learning in response to the first data being reclaimed to the second block, issue a command of reclaiming the first data to the second block in response to the predicted number of writes being greater than a threshold value, and issue a command of reclaiming third data of the first block to the second block in response to the predicted number of writes being smaller than or equal to the threshold value; and a bus connecting the processing circuitry, the host interface, the random access memory, and the memory interface.

16. The storage device of claim 15, further comprising:

a buffer memory configured to store information for the machine learning, wherein the processing circuitry is configured to cause the controller to communicate with the buffer memory.

17. The storage device of claim 15, wherein the processing circuitry is configured to cause the controller to:

collect the information;

preprocess the collected information;

perform training based on the preprocessed information; and compare the number of predicted writes with the threshold value.

18. The storage device of claim 15, wherein the number of writes is a number of writes performed in an erase program interval (EPI) between an erase operation and a program operation of the nonvolatile memory device.

* * * * *